US012593545B2

(12) United States Patent
Hsu et al.

(10) Patent No.: US 12,593,545 B2
(45) Date of Patent: Mar. 31, 2026

(54) DISPLAY APPARATUS AND MANUFACTURING METHOD THEREOF

(71) Applicant: AUO Corporation, Hsinchu (TW)

(72) Inventors: Yi-Yueh Hsu, Hsinchu (TW);
Kuan-Hsun Chen, Hsinchu (TW);
Yi-Sheng Jhao, Hsinchu (TW)

(73) Assignee: AUO Corporation, Hsinchu (TW)

( * ) Notice: Subject to any disclaimer, the term of this patent is extended or adjusted under 35 U.S.C. 154(b) by 345 days.

(21) Appl. No.: 18/330,382

(22) Filed: Jun. 7, 2023

(65) Prior Publication Data

US 2024/0274760 A1     Aug. 15, 2024

(30) Foreign Application Priority Data

Feb. 15, 2023    (TW) .................................. 112105257

(51) Int. Cl.
*H01L 33/54* (2010.01)
*H10H 20/853* (2025.01)
*H10W 90/00* (2026.01)
*H10H 20/01* (2025.01)

(52) U.S. Cl.
CPC .......... *H10H 20/853* (2025.01); *H10W 90/00* (2026.01); *H10H 20/0362* (2025.01)

(58) Field of Classification Search
CPC ............. H10H 20/853; H10H 20/0362; H10H 20/852; H10H 29/142; H10H 20/854; H01L 25/0753; H01L 25/167; G09F 9/33
See application file for complete search history.

(56) References Cited

U.S. PATENT DOCUMENTS

| | | | |
|---|---|---|---|
| 10,336,913 | B2 | 7/2019 | Nishijima et al. |
| 2016/0208138 | A1 | 7/2016 | Nishijima et al. |
| 2022/0262995 | A1 | 8/2022 | Li et al. |
| 2023/0030752 | A1 | 2/2023 | Chen et al. |

FOREIGN PATENT DOCUMENTS

| | | |
|---|---|---|
| CN | 111446348 | 4/2021 |
| CN | 115188782 | 10/2022 |
| KR | 20160128465 | 11/2016 |
| KR | 20220159936 | 12/2022 |
| TW | 202306145 | 2/2023 |

*Primary Examiner* — Elmito Breval
(74) *Attorney, Agent, or Firm* — JCIPRNET

(57) ABSTRACT

A display apparatus includes a driving backplane, a plurality of light emitting devices, a first encapsulation pattern, and a second encapsulation pattern. The light emitting devices are disposed on the driving backplane and electrically connected to the driving backplane. The first encapsulation pattern includes a first portion and a second portion. The first portion is disposed on the driving backplane. The second portion is disposed on the first portion of the first encapsulation pattern, covers a plurality of sidewalls of the light emitting devices, and has a plurality of first openings overlapping a plurality of top surfaces of the light emitting devices. The second encapsulation pattern is disposed on the first portion of the first encapsulation pattern and has a plurality of second openings. The second openings are overlapped with the top surfaces of the light emitting devices and the second portion of the first encapsulation pattern.

10 Claims, 7 Drawing Sheets

DISPLAY APPARATUS AND MANUFACTURING METHOD THEREOF

CROSS-REFERENCE TO RELATED APPLICATION

This application claims the priority benefit of Taiwan application serial no. 112105257, filed on Feb. 15, 2023. The entirety of the above-mentioned patent application is hereby incorporated by reference herein and made a part of this specification.

BACKGROUND

Technical Field

The disclosure relates to a photoelectric apparatus and a manufacturing method thereof; more particularly, the disclosure relates to a display apparatus and a manufacturing method thereof.

Description of Related Art

A light emitting diode (LED) display panel includes a driving backplane and a plurality of LED devices disposed on the driving backplane. Inheriting the characteristics of the LEDs, the LED display panel has advantages of reduced power consumption, high efficiency, high brightness, and short response time. Besides, compared to an organic light emitting diode (OLED) display panel, the LED display panel further exhibits benefits of easy color adjustment, long luminescent lifespan, and absence of image burn-in. Therefore, the LED display panel is considered as the next generation of display technology.

Generally, after the LED devices are transported to the driving backplane, various encapsulation patterns are sequentially formed on the driving backplane. However, the formation of each encapsulation pattern requires individual molding, hard baking and curing, and etching processes, which are labor-intensive, time-consuming, and costly.

SUMMARY

The disclosure relates to a display apparatus formed by performing reduced manufacturing steps.

The disclosure relates to a manufacturing method of a display apparatus capable of simplifying manufacturing steps.

According to an embodiment of the disclosure, a display apparatus including a driving backplane, a plurality of light emitting devices, a first encapsulation pattern, and a second encapsulation pattern is provided. The light emitting devices are disposed on the driving backplane and electrically connected to the driving backplane. The first encapsulation pattern includes a first portion and a second portion. The first portion is disposed on the driving backplane. The second portion is disposed on the first portion of the first encapsulation pattern, covers a plurality of sidewalls of the light emitting devices, and has a plurality of first openings overlapped with a plurality of top surfaces of the light emitting devices. The second encapsulation pattern is disposed on the first portion of the first encapsulation pattern and has a plurality of second openings. The second openings of the second encapsulation pattern are overlapped with the top surfaces of the light emitting devices and the second portion of the first encapsulation pattern.

According to an embodiment of the disclosure, a manufacturing method of a display apparatus includes following steps. A light emitting device array substrate is provided, where the light emitting device array substrate includes a driving backplane and a plurality of light emitting devices, and the light emitting devices are disposed on the driving backplane and electrically connected to the driving backplane. An encapsulation device is provided, where the encapsulation device includes a first encapsulation material layer and a second encapsulation material layer stacked together. The encapsulation device and the light emitting device array substrate are laminated, so that the first encapsulation material layer and the second encapsulation material layer are disposed on the driving backplane and encapsulate the light emitting devices, where the first encapsulation material layer is disposed between the second encapsulation material layer and the light emitting devices. The first encapsulation material layer and the second encapsulation material layer are cured to form a first encapsulation layer and a second encapsulation layer. The first encapsulation layer and the second encapsulation layer are thinned down, so that the first encapsulation layer and the second encapsulation layer respectively form a first encapsulation pattern and a second encapsulation pattern, where the first encapsulation pattern includes a first portion and a second portion, the first portion of the first encapsulation pattern is disposed on the driving backplane, the second portion of the first encapsulation pattern is disposed on the first portion of the first encapsulation pattern and covers the a plurality of sidewalls of the light emitting devices, the second portion of the first encapsulation pattern has a plurality of first openings respectively exposing a plurality of top surfaces of the light emitting devices, the second encapsulation pattern is disposed on the first portion of the first encapsulation pattern and has a plurality of second openings exposing the top surfaces of the light emitting devices and the second portion of the first encapsulation pattern.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figures 1A, 1B:
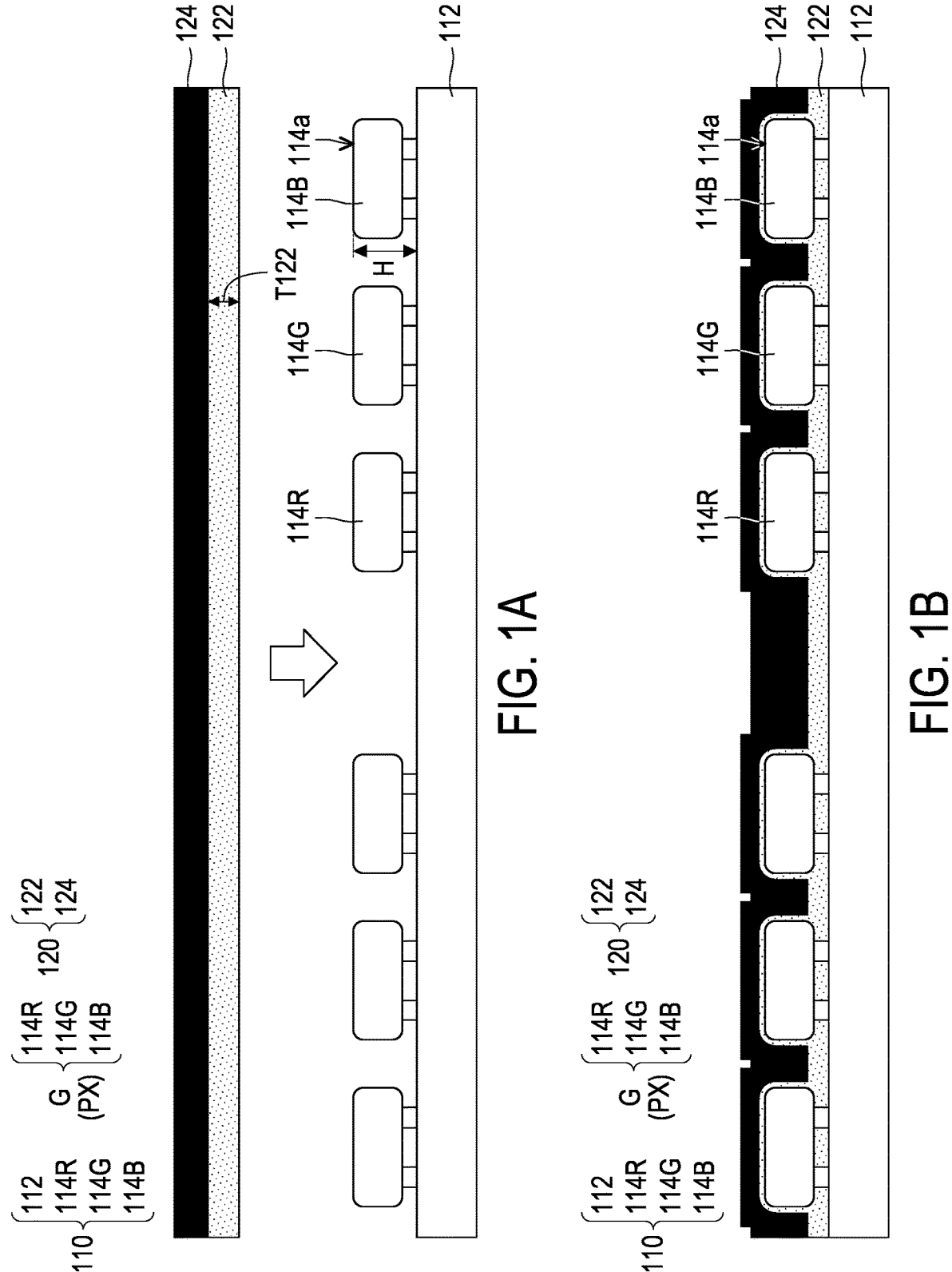
FIG. 1A to FIG. 1E are schematic cross-sectional flow-charts of a manufacturing method of a display apparatus according to an embodiment of the disclosure.

Reference will now be made in detail to the exemplary embodiments of the disclosure, examples of which are illustrated in the accompanying drawings. Whenever possible, the same reference numbers are used in the drawings and the description to refer to the same or like parts.

It should be understood that when an element, such as a layer, a film, a region, or a substrate is referred to as being "on" or "connected to" another element, it can be directly on or connected to the another element, or an intermediate element may also be present. By contrast, when an element is referred to as being "directly on" or "directly connected to" another element, no intermediate element is present. As used herein, being "connected" may refer to a physical and/or electrical connection. Furthermore, being "electrically connected" or "coupled" may refer to the presence of other elements between the two elements.

The terminology "about," "approximately," or "substantially" used herein includes the average of the stated value and an acceptable range of deviations from the particular value as determined by those skilled in the art. For instance, the terminology "about" may refer to as being within one or more standard deviations of the stated value, or within ±30%, ±20%, ±10%, or ±5%. Furthermore, the terminology "about," "approximately," or "substantially" as used herein may be chosen from a range of acceptable deviations or standard deviations depending on the optical properties, etching properties, or other properties, rather than one standard deviation for all properties.

Unless otherwise defined, all terminologies (including technical and scientific terminologies) used herein have the same meaning as commonly understood by people having ordinary skill in the art to which the disclosure belongs. It is understood that these terminologies, such as those defined in commonly used dictionaries, should be interpreted as having meanings consistent with the relevant art and the background or context of the disclosure, and should not be interpreted in an idealized or overly formal way, unless otherwise defined in the embodiments of the disclosure.

FIG. 1A to FIG. 1E are schematic cross-sectional flow-charts of a manufacturing method of a display apparatus according to an embodiment of the disclosure. With reference to FIG. 1A, a light emitting device array substrate 110 is provided. The light emitting device array substrate 110 includes a driving backplane 112 and a plurality of light emitting devices 114R, 114G, and 114B. The light emitting devices 114R, 114G, and 114B are disposed on the driving backplane 112 and are electrically connected to the driving backplane 112. In detail, in this embodiment, the driving backplane 112 includes a substrate (not shown) and a circuit layer (not shown) disposed on the substrate, the circuit layer includes a plurality of sub-pixel driving circuits (not shown) and a plurality of pad groups electrically connected to the sub-pixel driving circuits (not shown), respectively. Besides, a plurality of electrodes (not shown) of each of the light emitting devices 114R, 114G, and 114B are electrically connected to a plurality of pads of a corresponding pad group.

In this embodiment, the light emitting devices 114R, 114G, and 114B may be categorized into a plurality of light emitting device groups G, and each of the light emitting device groups G may include the light emitting devices 114R, 114G, and 114B configured to emit a first color light beam, a second color light beam, and a third color light beam, respectively. Each light emitting device group G and the sub-pixel driving circuits (not shown) electrically connected thereto may constitute a pixel PX. In this embodiment, the first color light beam, the second color light beam, and the third color light beam are, for instance, red light, green light, and blue light, which should however not be construed as a limitation in the disclosure. In this embodiment, the light emitting devices 114R, 114G, and 114B are, for instance, micro LEDs (μLED), which should however not be construed as a limitation in the disclosure.

As shown in FIG. 1A, an encapsulation device 120 is provided. The encapsulation device 120 includes a first encapsulation material layer 122 and a second encapsulation material layer 124 that are stacked together. In this embodiment, the first encapsulation material layer 122 is configured to face the light emitting device array substrate 110, and a thickness T122 of the first encapsulation material layer 122 is less than a distance H from a top surface 114a of the light emitting device 114B to the driving backplane 112. For instance, in this embodiment, the first encapsulation material layer 122 is, for instance, a white encapsulation layer, and the second encapsulation material layer 124 is, for instance, a black encapsulation layer, which should however not be construed as a limitation in the disclosure.

With reference to FIG. 1A and FIG. 1B, the encapsulation device 120 and the light emitting device array substrate 110 are laminated, so that the first encapsulation material layer 122 and the second encapsulation material layer 124 are disposed on the driving backplane 112 and encapsulate the light emitting devices 114R, 114B, and 114G, where the first encapsulation material layer 122 is disposed between the second encapsulation material layer 124 and the light emitting devices 114R, 114B, and 114G. In this embodiment, since the thickness T122 of the first encapsulation material layer 122 of the encapsulation device 120 is less than the distance H from the top surface 114a of the light emitting device 114B to the driving backplane 112, the first encapsulation material layer 122 may substantially conformally cover the driving backplane 112 and the light emitting devices 114R, 114G, and 114B.

It is worth mentioning that since the encapsulation device 120 includes the first encapsulation material layer 122 and the second encapsulation material layer 124, when the lamination process is performed on the encapsulation device 120 and the light emitting device array substrate 110, the first encapsulation material layer 122 and the second encapsulation material layer 124 are laminated onto the light emitting device array substrate 110 and molded in the same process. As such, it is not necessary to laminate and mold the first encapsulation material layer 122 and the second encapsulation material layer 124 respectively onto the light emitting device array substrate 110 in multiple processes, so as to simplify the manufacturing steps.

In this embodiment, it is favorable to select a material whose viscosity may decrease after being heated as the first encapsulation material layer 122 and the second encapsulation material layer 124. For instance, in this embodiment, the material of the first encapsulation material layer 122 and/or the second encapsulation material layer 124 may include epoxy, acrylic, silicon, or other appropriate materials, which should however not be construed as a limitation in the disclosure.

Figures 1C, 1D:
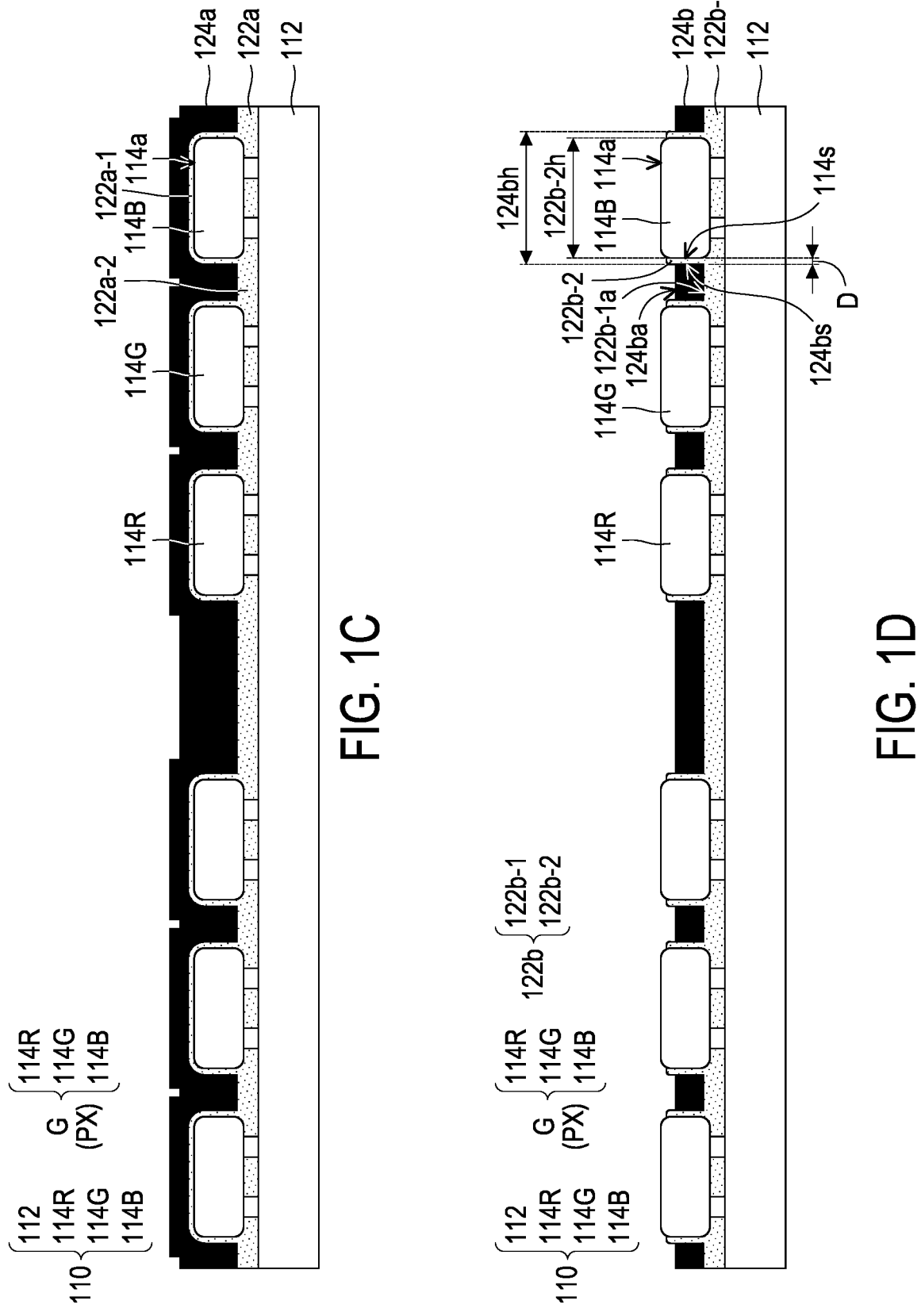

With reference to FIG. 1B and FIG. 1C, the first encapsulation material layer 122 and the second encapsulation material layer 124 are cured to form a first encapsulation layer 122a and a second encapsulation layer 124a. For instance, in this embodiment, a heating process may be performed to cure the first encapsulation material layer 122 and the second encapsulation material layer 124. However, the disclosure is not limited thereto. In other embodiments, other processes (e.g., an irradiation process) may also be applied to cure the first encapsulation material layer 122 and the second encapsulation material layer 124.

With reference to FIG. 1C and FIG. 1D, then, the first encapsulation layer 122a and the second encapsulation layer 124a are thinned down, so that the first encapsulation layer 122a and the second encapsulation layer 124a respectively form a first encapsulation pattern 122b and a second encapsulation pattern 124b. As shown in FIG. 1D, the first encapsulation pattern 122b includes a first portion 122b-1 and a second portion 122b-2. The first portion 122b-1 of the first encapsulation pattern 122b is disposed on the driving backplane 112. The second portion 122b-2 of the first encapsulation pattern 122b is disposed on the first portion 122b-1 of the first encapsulation pattern 122b and covers a plurality of sidewalls 114s of the light emitting devices 114R, 114G, and 114B. The second portion 122b-2 of the first encapsulation pattern 122b has a plurality of first openings 122b-2h respectively exposing the top surfaces 114a of the light emitting devices 114R, 114G, and 114B. The second encapsulation pattern 124b is disposed on the first portion 122b-1 of the first encapsulation pattern 122b and has a plurality of second openings 124bh exposing the top surfaces 114a of the light emitting devices 114R, 114G, and 114B and the second portion 122b-2 of the first encapsulation pattern 122b.

As shown in FIG. 1C and FIG. 1D, in this embodiment, a portion of the first encapsulation layer 122a and a portion of the second encapsulation layer 124a on the top surfaces 114a of the light emitting devices 114R, 114G, and 114B may be removed selectively applying wet and dry etching processes, so as to form the first encapsulation pattern 122b and the second encapsulation pattern 124b that expose at least the top surfaces 114a of the light emitting devices 114R, 114G, and 114B.

In the dry etching process, the second encapsulation layer 124a and one portion 122a-1 (marked in FIG. 1C) of the first encapsulation layer 122a between the second encapsulation layer 124a and the top surfaces 114a of the light emitting devices 114R, 114G, and 114B are in contact with a reactive gas used in the dry etching process, and the other portion 122a-2 of the first encapsulation layer 122a between the second encapsulation layer 124a and the driving backplane 112 and between the light emitting devices 114G and 114B is covered by a thicker portion of the second encapsulation layer 124a and thus does not contact the reactive gas. Therefore, a top surface 124ba of the second encapsulation pattern 124b obtained by performing the dry etching process on the second encapsulation layer 124a is rougher than the top surface 122b-1a of the first portion 122b-1 of the first encapsulation pattern 122b not in contact with the reactive gas (i.e., the other portion 122a-2 of the first encapsulation layer 122a), where the top surface 122b-1a of the first portion 122b-1 of the first encapsulation pattern 122b contacts the second encapsulation pattern 124b, the top surface 124ba of the second encapsulation pattern 124b faces away from the driving backplane 112, and the top surface 122b-1a of the first portion 122b-1 of the first encapsulation pattern 122b is overlapped with the top surface 124ba of the second encapsulation pattern 124b.

In addition, in this embodiment, etching rates of the first encapsulation layer 122a and the second encapsulation layer 124a to the reactive gas may be different, and the second portion 122b-2 of the first encapsulation pattern 122b obtained by etching the first encapsulation layer 122a may partially protrude from the second encapsulation pattern 124b obtained by etching the second encapsulation layer 124a, which should however not be construed as a limitation in the disclosure.

It is worth mentioning that the first encapsulation layer 122a and the second encapsulation layer 124a are thinned down to form the first encapsulation pattern 122b and the second encapsulation pattern 124b in the same process. In the related art, the encapsulation layers are respectively formed and thinned down in multiple processes; by contrast, the total amount of the removed portion of the first encapsulation layer 122a and the removed portion of second encapsulation layer 124a in the thinning process is less, and the amount of residues to be cleaned after the thinning process is less, which is conducive to reducing the difficulty of cleaning.

As shown in FIG. 1D, the first openings 122b-2h of the second portion 122b-2 of the first encapsulation pattern 122b are overlapped with the top surfaces 114a of light emitting devices 114R, 114G, and 114B, respectively. The second openings 124bh of the second encapsulation pattern 124b are overlapped with the top surfaces 114a of the light emitting devices 114R, 114G, and 114B and the second portion 122b-2 of the first encapsulation pattern 122b. The second portion 122b-2 of the first encapsulation pattern 122b and the light emitting devices 114R, 114G, and 114B are located in the second openings 124bh of the second encapsulation pattern 124b.

In this embodiment, the second encapsulation pattern 124b has a sidewall 124bs defining the second openings 124bh, and the second portion 122b-2 of the first encapsulation pattern 122b is sandwiched between the sidewall 124bs of the second encapsulation pattern 124b and the sidewalls 114s of the light emitting devices 114R, 114G, and 114B. The second encapsulation pattern 124b is separated from the light emitting devices 114R, 114G, and 114B by the first encapsulation pattern 122b, and the second encapsulation pattern 124b is not in contact with the light emitting devices 114R, 114G, and 114B. The sidewall 124bs of the second encapsulation pattern 124b and the sidewall 114s of the light emitting devices 114R, 114G, and 114B are spaced from each other by a distance D.

Figure 1E:
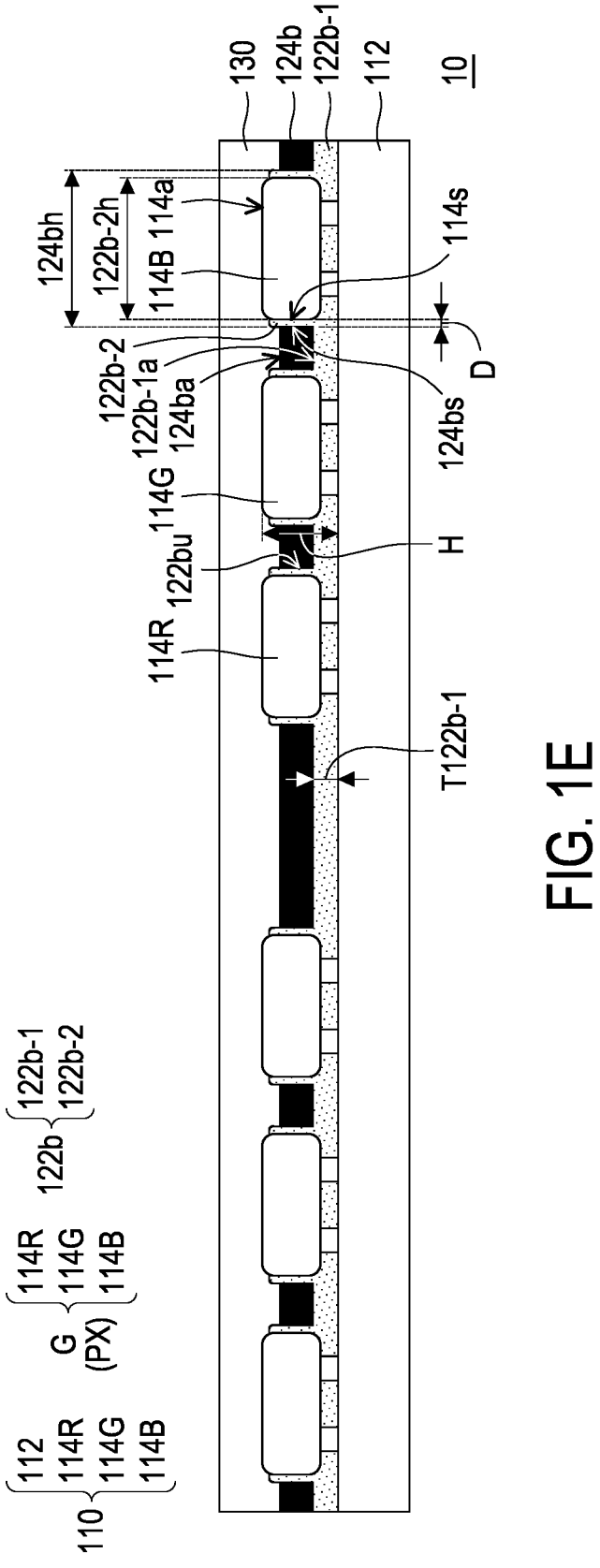
Figures 2A, 2B:
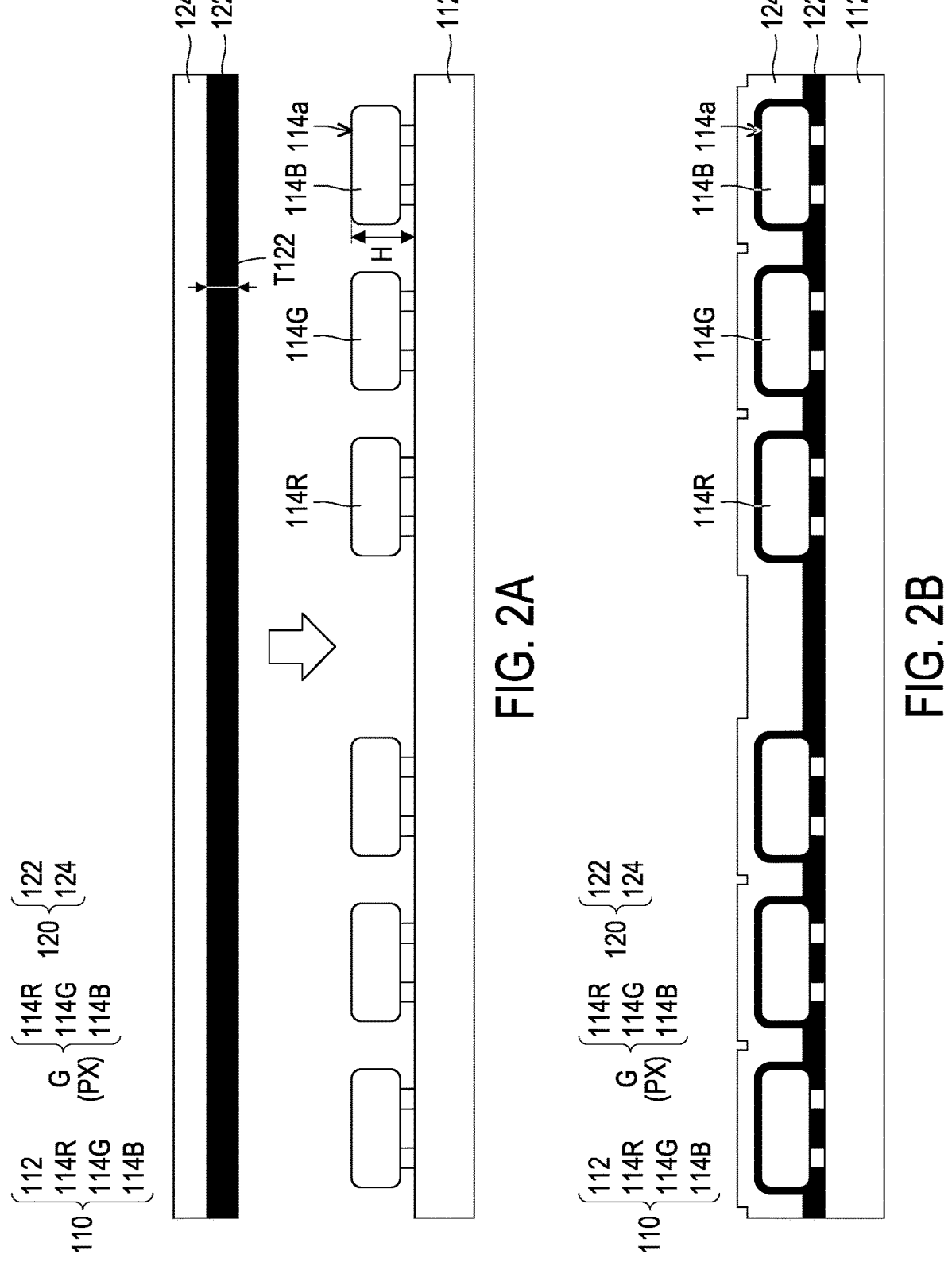
FIG. 2A to FIG. 2E are schematic cross-sectional flow-charts of a manufacturing method of a display apparatus according to another embodiment of the disclosure.
Figures 2C, 2D:
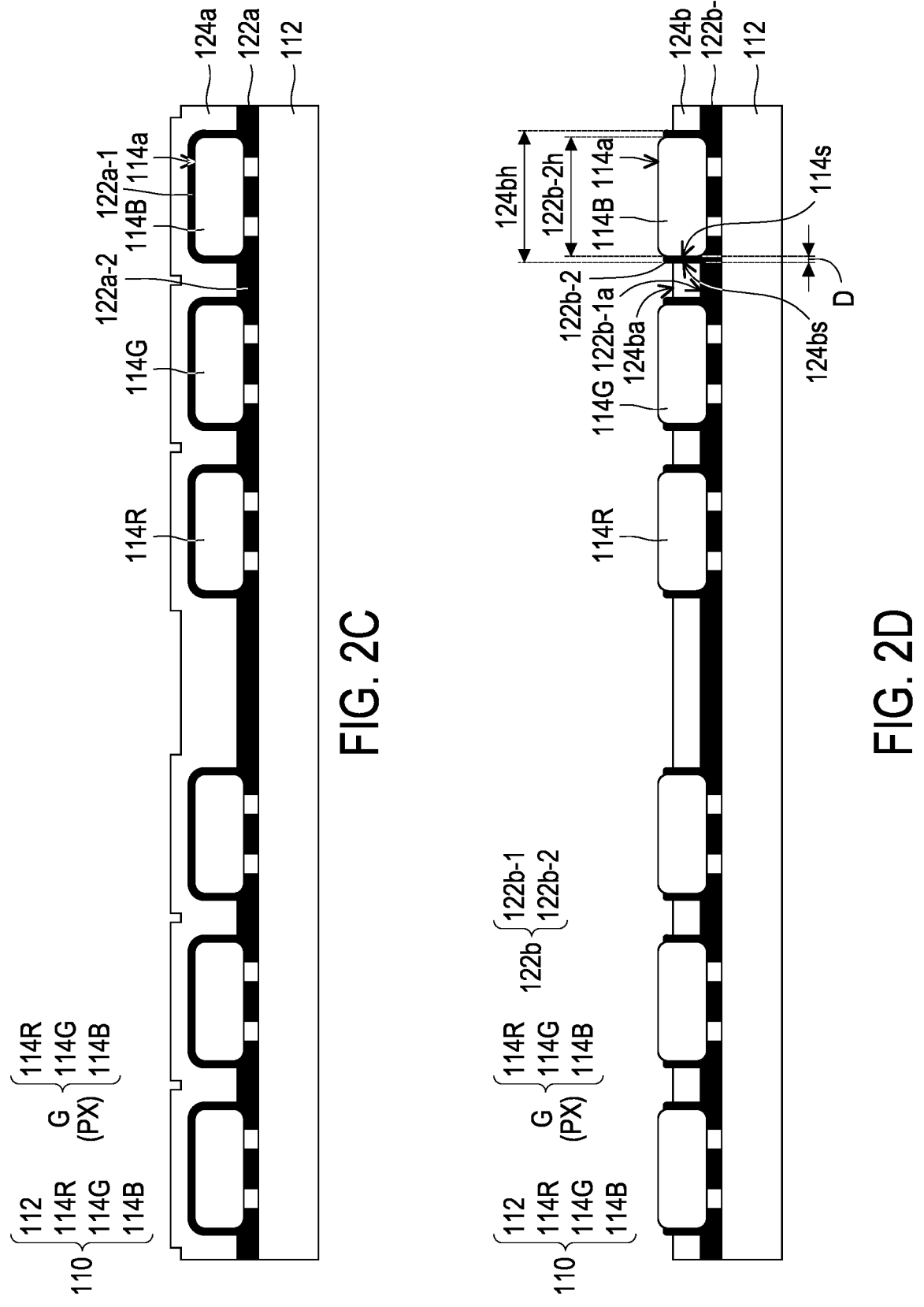
Figure 2E:
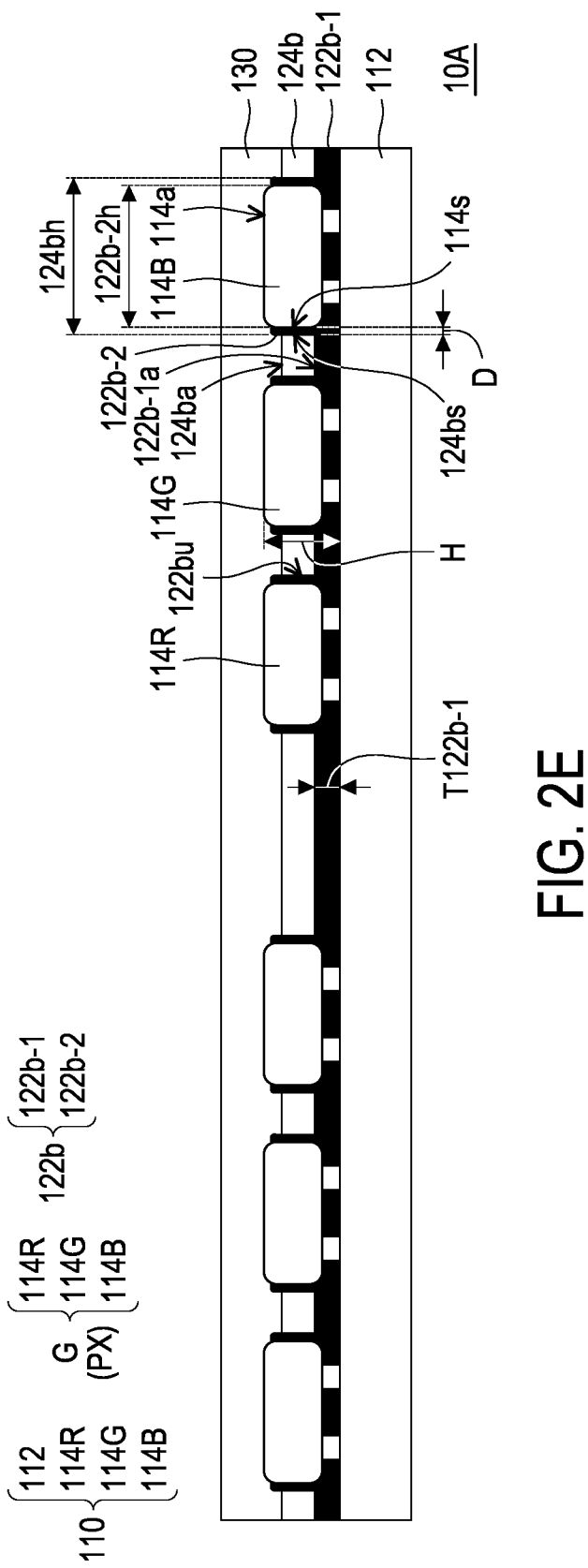

With reference to FIG. 1D and FIG. 1E, in this embodiment, a surface encapsulation layer 130 may be formed on the first encapsulation pattern 122b, the second encapsulation pattern 124b, and the top surfaces 114a of the light emitting devices 114R, 114G, and 114B. Here, the display apparatus 10 provided in this embodiment is completely formed. In this embodiment, the surface encapsulation layer 130 may be a transparent encapsulation material layer or an optical film, which should however not be construed as a limitation in the disclosure. According to this embodiment, it is worth noting that the surface encapsulation layer 130 not only directly contacts the top surfaces 114a of the light emitting devices 114R, 114G, and 114B and the second encapsulation pattern 124b but also directly contacts the second portion 122b-2 of the first encapsulation pattern 122b.

In this embodiment, the light emitting devices 114R, 114G, and 114B are surrounded by second portion 122b-2 of the first encapsulation pattern 122b, and a material of the first encapsulation pattern 122b includes a reflective substance (including but not limited to white particles). The second portion 122b-2 of the first encapsulation pattern 122b may reflect light beams emitted by the light emitting devices 114R, 114G, and 114B, which is conducive to improvement of the light emitting efficiency of the display apparatus 10.

In this embodiment, the second encapsulation pattern 124b has a light shielding substance (including but not limited to carbon black particles), and the second encapsulation pattern 124b may cover a light reflection portion (including but not limited to a metal circuit) of the circuit layer (not shown) of the driving backplane 112, which is conducive to enhancement of visual effects of the display apparatus 10.

Note that the same or similar elements in the previous embodiments will be designated by the same or similar reference numerals in the following embodiments, and the same technical contents are omitted below and may be referred to as those provided in the previous embodiments.

FIG. 2A to FIG. 2E are schematic cross-sectional flow-charts of a manufacturing method of a display apparatus according to another embodiment of the disclosure.

The manufacturing process of a display apparatus 10A depicted in FIG. 2A to FIG. 2E is similar to the manufacturing process of the display apparatus 10 depicted in FIG. 1A to FIG. 1E and thus will not be further described hereinafter. The difference therebetween lies in that the materials of the first encapsulation material layer 122 and the second encapsulation material layer 124 are different. In detail, in the embodiments depicted in FIG. 2A to FIG. 2E, the first encapsulation material layer 122 is a black encap-sulation layer, and the second encapsulation material layer 124 is a transparent encapsulation layer. In the embodiment depicted in FIG. 2A to FIG. 2E, the first encapsulation pattern 122*b* obtained by curing and etching the first encap-sulation material layer 122 has light shielding properties, and the second portion 122*b*-2 of the first encapsulation pattern 122*b* is disposed around the light emitting devices 114R, 114G, and 114B. The second portion 122*b*-2 of the first encapsulation pattern 122*b* may prevent the light beams emitted by the adjacent light emitting devices 114R, 114G, and 114B from interfering with each other, which is condu-cive to improvement of display effects of the display appa-ratus 10A.

Figure 3:
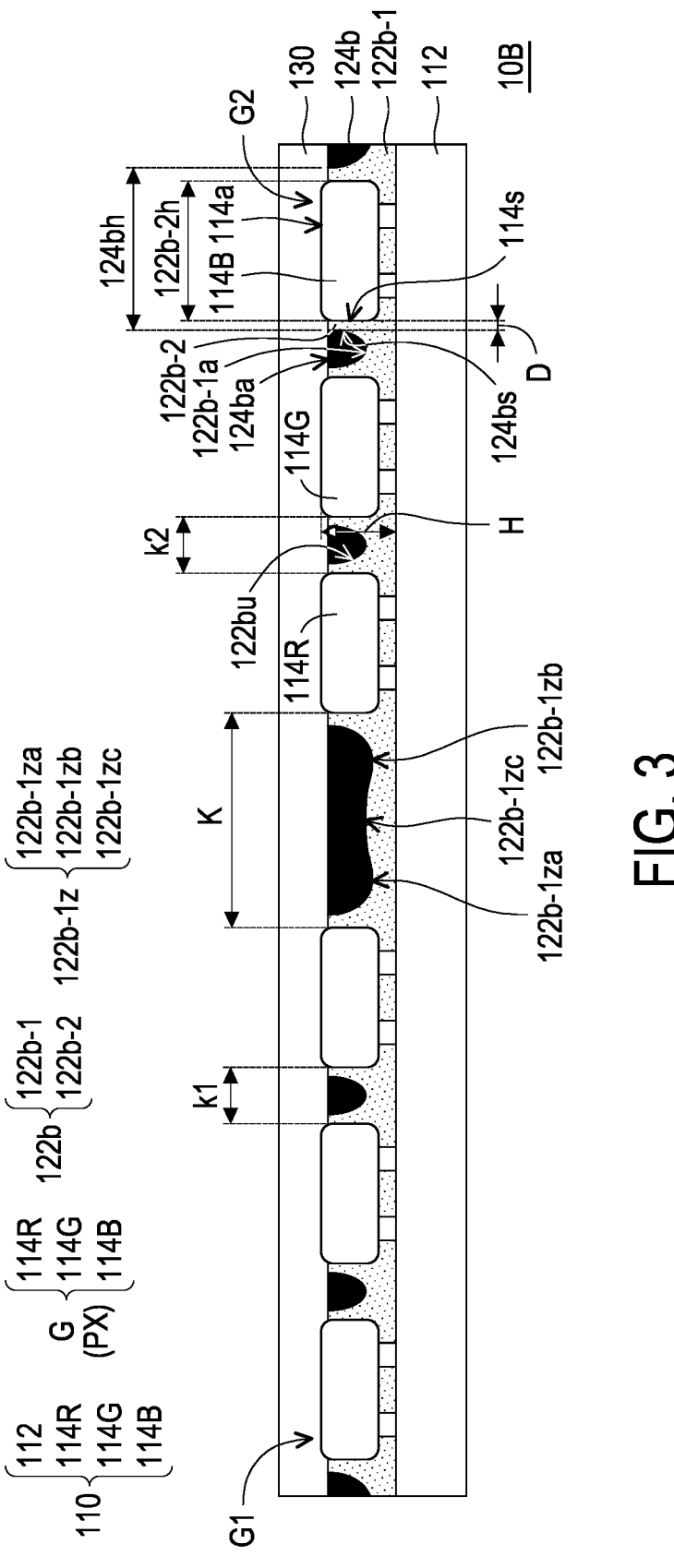
FIG. 3 is a schematic cross-sectional view of a display device according to still another embodiment of the disclosure.

FIG. 3 is a schematic cross-sectional view of a display device according to still another embodiment of the disclo-sure. A display apparatus 10B depicted in FIG. 3 is similar to the display apparatus 10 depicted in FIG. 1E, and the differences therebetween are described below.

In the embodiment depicted in FIG. 1E, the thickness T122*b*-1 of the first portion 122*b*-1 of the first encapsulation pattern 122*b* is about ¼ the distance H from the top surface 114*a* of the light emitting device 114B to the driving backplane 112, and a sectional line of a recess 122*bu* defined by the second portion 122*b*-2 of the first encapsulation pattern 122*b* on the sidewalls 114*s* between two adjacent light emitting devices 114G and 114B and the first portion 122*b*-1 of the first encapsulation pattern 122*b* between the two adjacent light emitting devices 114G and 114B is substantially shaped as ㄩ (the 37th letter of the Chinese Zhuyin alphabet, similar to the letter U in square font).

In the embodiment depicted in FIG. 3, the thickness T122*b*-1 of the first portion 122*b*-1 of the first encapsulation pattern 122*b* is about ½ the distance H from the top surface 114*a* of the light emitting device 114B to the driving backplane 112, and a sectional line of a recess 122*bu* defined by the second portion 122*b*-2 of the first encapsulation pattern 122*b* on the sidewalls 114*s* between two adjacent light emitting devices 114G and 114B and the first portion 122*b*-1 of the first encapsulation pattern 122*b* between the two adjacent light emitting devices 114G and 114B is substantially shaped as a letter U.

In addition, in the embodiment depicted in FIG. 3, the light emitting device groups G of a plurality of pixels PX include a first light emitting device group G1 and a second light emitting device group G2 of two adjacent pixels PX, a distance K between the first light emitting device group G1 and the second light emitting device group G2 is greater than a distance k1 between the light emitting devices 114G and 114B of the first light emitting device group G1 and a distance k2 between the light emitting devices 114G and 114B of the second light emitting device group G2, the first portion 122*b*-1 of the first encapsulation pattern 122*b* includes a first region 122*b*-1*z* located between the first light emitting device group G1 and the second light emitting device group G2, the first region 122*b*-1*z* has a first micro recess 122*b*-1*za* approaching the first light emitting device group, a second micro recess 122*b*-1*zb* approaching the second light emitting device group G2, and a micro protru-sion 122*b*-1*zc* connected between the first micro recess 122*b*-1*za* and the second micro recess 122*b*-1*zb*. The first micro recess 122*b*-1*za*, the micro protrusion 122*b*-1*zc*, and the second micro recess 122*b*-1*zb* are connected to form a smooth uneven surface. In this embodiment, a sectional line of the smooth uneven surface is shaped as ω (the lowercase symbol for omega in Greek). In this embodiment, the smooth uneven surface may be mirror-distributed with respect to a virtual reference plane (not shown) that is perpendicular to the driving backplane 112 and passes through a vertex of the micro protrusion 122*b*-1*zc*.

In the embodiment depicted FIG. 3, the second portion 122*b*-2 of the first encapsulation pattern 122*b* may have the same height as that of the second encapsulation pattern 124*b*. However, the disclosure is not limited thereto. In other embodiments similar to FIG. 3, the second portion 122*b*-2 of the first encapsulation pattern 122*b* may protrude from the second encapsulation pattern 124*b*.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display apparatus, comprising:
   a driving backplane;
   a plurality of light emitting devices, disposed on the driving backplane and electrically connected to the driving backplane;
   a first encapsulation pattern, comprising:
   a first portion, disposed on the driving backplane; and
   a second portion, disposed on the first portion of the first encapsulation pattern, covering a plurality of sidewalls of the light emitting devices, and having a plurality of first openings overlapped with a plurality of top sur-faces of the light emitting devices; and
   a second encapsulation pattern, disposed on the first portion of the first encapsulation pattern and having a plurality of second openings, wherein the second open-ings of the second encapsulation pattern are overlapped with the top surfaces of the light emitting devices and the second portion of the first encapsulation pattern, the second encapsulation pattern has a sidewall defining the second openings, and the second portion of the first encapsulation pattern is sandwiched between the side-wall of the second encapsulation pattern and the side-walls of the light emitting devices.

2. The display apparatus according to claim 1, wherein the sidewall of the second encapsulation pattern and one of the sidewalls of the light emitting devices are spaced from each other by a distance.

3. The display apparatus according to claim 1, wherein the first portion of the first encapsulation pattern has a top surface in contact with the second encapsulation pattern, the second encapsulation pattern has a top surface facing away from the driving backplane, the top surface of the first portion of the first encapsulation pattern is overlapped with the top surface of the second encapsulation pattern, and the top surface of the second encapsulation pattern is rougher than the top surface of the first portion of the first encapsulation pattern.

4. The display apparatus according to claim 1, further comprising:

a surface encapsulation layer, directly contacting the second portion of the first encapsulation pattern, the second encapsulation pattern, and the top surfaces of the light emitting devices.

5. The display apparatus according to claim 1, wherein the second portion of the first encapsulation pattern partially protrudes from the second encapsulation pattern.

6. The display apparatus according to claim 1, wherein the light emitting devices comprise a first light emitting device group and a second light emitting device group, a distance between the first light emitting device group and the second light emitting device group is greater than a distance between the light emitting devices of the first light emitting device group emitting and a distance between the light emitting devices of the second light emitting device group, the first portion of the first encapsulation pattern comprises a first region located between the first light emitting device group and the second light emitting device group, and the first region has a first micro recess approaching the first light emitting device group, a second micro recess approaching the second light emitting device group, and a micro protrusion between the first micro recess and the second micro recess.

7. A manufacturing method of a display apparatus, comprising:

providing a light emitting device array substrate, wherein the light emitting device array substrate comprises a driving backplane and a plurality of light emitting devices, and the light emitting devices are disposed on the driving backplane and electrically connected to the driving backplane;

providing an encapsulation device, wherein the encapsulation device comprises a first encapsulation material layer and a second encapsulation material layer stacked together;

laminating the encapsulation device and the light emitting device array substrate, so that the first encapsulation material layer and the second encapsulation material layer are disposed on the driving backplane and encapsulate the light emitting devices, wherein the first encapsulation material layer is disposed between the second encapsulation material layer and the light emitting devices;

curing the first encapsulation material layer and the second encapsulation material layer to form a first encapsulation layer and a second encapsulation layer; and thinning down the first encapsulation layer and the second encapsulation layer, so that the first encapsulation layer and the second encapsulation layer respectively form a first encapsulation pattern and a second encapsulation pattern, wherein the first encapsulation pattern comprises a first portion and a second portion, the first portion of the first encapsulation pattern is disposed on the driving backplane, the second portion of the first encapsulation pattern is disposed on the first portion of the first encapsulation pattern and covers the a plurality of sidewalls of the light emitting devices, the second portion of the first encapsulation pattern has a plurality of first openings respectively exposing a plurality of top surfaces of the light emitting devices, the second encapsulation pattern is disposed on the first portion of the first encapsulation pattern and has a plurality of second openings exposing the top surfaces of the light emitting devices and the second portion of the first encapsulation pattern;

wherein the second encapsulation pattern has a sidewall defining the second openings, and the second portion of the first encapsulation pattern is sandwiched between the sidewall of the second encapsulation pattern and the sidewalls of the light emitting devices.

8. The manufacturing method of the display apparatus according to claim 7, wherein a thickness of the first encapsulation material layer of the encapsulation device is less than a distance from one of the top surfaces of the light emitting devices to the driving backplane.

9. The manufacturing method of the display apparatus according to claim 7, wherein the sidewall of the second encapsulation pattern and one of the sidewalls of the light emitting devices are spaced from each other by a distance.

10. The manufacturing method of the display apparatus according to claim 7, further comprising:

forming a surface encapsulation layer on the first encapsulation pattern, the second encapsulation pattern, and the top surfaces of the light emitting devices, wherein the surface encapsulation layer directly contacts the second portion of the first encapsulation pattern, the second encapsulation pattern, and the top surfaces of the light emitting devices.

* * * * *